(12) United States Patent
Matsutori et al.

(10) Patent No.: US 7,450,219 B2
(45) Date of Patent: Nov. 11, 2008

(54) RETICLE-CARRYING CONTAINER

(75) Inventors: Chiaki Matsutori, Kikuchi (JP); Koichi Yanagihara, Kikuchi (JP)

(73) Assignee: Miraial Co., Ltd. (JP)

( * ) Notice: Subject to any disclaimer, the term of this patent is extended or adjusted under 35 U.S.C. 154(b) by 324 days.

(21) Appl. No.: 11/282,575

(22) Filed: Nov. 21, 2005

(65) Prior Publication Data
US 2006/0109449 A1  May 25, 2006

(30) Foreign Application Priority Data
Nov. 24, 2004  (JP)  ............................. 2004-339375

(51) Int. Cl.
*G03B 27/62* (2006.01)
*G03B 27/58* (2006.01)
*B65D 85/00* (2006.01)

(52) U.S. Cl. ............................. 355/75; 355/72; 206/710
(58) Field of Classification Search .................. 355/75, 355/72; 206/710; 430/5
See application file for complete search history.

(56) References Cited

U.S. PATENT DOCUMENTS

| | | | |
|---|---|---|---|
| 4,511,038 A | 4/1985 | Miller et al. | 206/454 |
| 4,888,473 A * | 12/1989 | Rossi et al. | 235/376 |
| 5,725,100 A | 3/1998 | Yamada | 206/710 |
| 5,786,897 A * | 7/1998 | Ototake | 356/511 |
| 6,216,873 B1 | 4/2001 | Fosnight et al. | 206/710 |
| 6,825,916 B2 * | 11/2004 | Wiseman et al. | 355/75 |
| 6,906,783 B2 * | 6/2005 | del Puerto et al. | 355/53 |
| 2004/0004704 A1 * | 1/2004 | Wiseman et al. | 355/75 |

FOREIGN PATENT DOCUMENTS

| | | |
|---|---|---|
| JP | 10-017051 | 1/1998 |
| JP | 10-163094 | 6/1998 |
| JP | 2005-321529 | 11/2005 |

* cited by examiner

*Primary Examiner*—Diane I Lee
*Assistant Examiner*—Steven H Whitesell-Gordon
(74) *Attorney, Agent, or Firm*—Bacon & Thomas, PLLC

(57) ABSTRACT

The present invention supports a reticle 12 in a safe and secure manner. A reticle-carrying container 11 includes a pod 13 for storing the reticle 12, a door 14 and a seal 15 for blocking and sealing hermetically the pod 13. A pair of reticle retainers 25 and 45 is provided on the insides of the pod 13 and door 14. Each of the reticle retainers 25 and 45 includes an inclined plane 28 that contacts an upper corner 12A or a lower corner 12B of peripheral edge of the reticle 12 and supports the reticle 12 elastically. The inside of the inclined plane 28 is provided with concave portions 31 and 52 that enables a shock-absorbing function of allowing the deformation of the inclined plane 28 and supporting the reticle elastically, at the time of contact with the upper corner 12A or the lower corner 12B of peripheral edge of the reticle 12.

13 Claims, 5 Drawing Sheets

RETICLE-CARRYING CONTAINER

CROSS-REFERENCE TO RELATED APPLICATION

This application claims, under 35 USC 119, priority of Japanese application No. 2004-339375 filed Nov. 24, 2004.

BACKGROUND OF THE INVENTION

1. Field of the Invention

The present invention relates to a reticle-carrying container for carrying a reticle used for a light exposure apparatus or the like that transfers a set pattern to a substrate.

2. Description of the Background Art

Semiconductor devices and liquid crystal display devices are manufactured in process of photolithography. In this process, an image of pattern formed on a reticle (including a photo mask) is projected and transferred by a light exposure apparatus onto a substrate such as a semiconductor wafer and a glass plate. At that time, the transferred pattern reacts with a photosensitive agent applied to the substrate, and then a circuit is formed through the subsequent operations.

During this process, a reticle is stored in a dedicated reticle-carrying container in order to prevent contamination with dust, etc. and damage from contact with other components.

For making an intricate circuit, it is necessary to provide a large number of circuit patterns on the substrate. Accordingly, many reticles are prepared and many patterns are formed in layers on the substrate.

FIG. 2 shows one example of an apparatus used in the photolithography process. In the figure, a numeral number 1 indicates a light exposure apparatus that projects and transfers a circuit pattern onto the substrate. A numeral number 2 denotes a reticle stocker in which a large number of reticles are stored and retained. A numeral number 3 shows a reticle-carrying container which stores reticles. A numeral number 4 indicates a transfer rail provided between a light exposure apparatus 1 and a reticle stocker 2, which transfers the reticles stored in a reticle-carrying container 3 between these two components. A numeral number 5 shows a transfer mechanism provided on the transfer rail 4, which holds and transfers directly the reticle-carrying container 3.

These components are controlled by a controller (not shown). With this, the reticles required for a circuit pattern stored in the reticle-carrying container 3 are transferred by the transfer mechanism 5 on the transfer rail 4 from the reticle stocker 2 to the light exposure apparatus 1. The reticles no longer required in the light exposure apparatus 1 are returned to the reticle stocker 2 by the transfer mechanism 5 on the transfer rail 4.

The reticles used in the above described process are precision components. If the reticles are contaminated with dust, etc. or damaged by contact with other components, it is impossible to form an accurate circuit pattern. Therefore, various kinds of reticle-carrying containers 3 for supporting the reticles safely and securely have been suggested so far.

One example is shown in a patent document 1 (Japanese Patent Laid-open No. 10-163094). The reticle supporting means set forth in the patent document 1 is a pin. As means for supporting a reticle from underneath, the reticle supporting pins are provided on the four corners of the reticle. In addition, as means for supporting a reticle from its periphery so as not to be shifted in a horizontal direction, the stopper pins for preventing a horizontal movement are provided. Moreover, as means for supporting a reticle from above, the reticle retainer is provided. These means support and fix the reticle in X, Y and Z directions.

Additionally, a pellicle may be attached to the reticle. In this case, a pellicle-carrying container may be utilized. For the pellicle-carrying container as well, various kinds of pellicle-carrying containers for supporting a pellicle safely and securely have been proposed so far.

One example is described in a patent document 2 (Japanese Patent Laid-open No. 10-17051). The pellicle supporting means set forth in the patent document 2 are a projected line and an elastically deforming member. As means for supporting a pellicle from underneath, the projected line and the elastically deforming member are provided in the positions corresponding to the peripheral edge of the pellicle. In addition, as means for supporting a pellicle from its periphery so as not to be shifted in a horizontal direction, an engagement portion for preventing a horizontal movement are provided. Moreover, as means for supporting a pellicle from above, a portion of the lid is provided as a tapered retaining portion. These means support and fix the pellicle in X, Y and Z directions.

However, the above described reticle-carrying container has such a structure in which the highly rigid pins contact and support directly the lower side and upper side of the reticle. This causes the vibrations of the reticle-carrying container to be conveyed directly to the reticle, which is undesirable in treating a precision component.

In addition, since the member for supporting the lower side of the reticle has a flat surface, the reticle may be shifted in a horizontal direction due to vibrations, etc. from outside. Also, there is a gap between the stopper and the peripheral edge of the reticle, and thus the reticle may be shifted in a horizontal direction within the range of this gap.

As the circuit becomes higher in density and more complicated, the reticle would be increased in the degree of precision. Therefore, it is desired to treat the reticle more carefully.

Likewise, it is desired to handle the pellicle more cautiously so as to have no harmful effects on the reticle.

SUMMARY OF THE INVENTION

The reticle-carrying container of the present invention is improved in such a manner as to allow the reticle and the pellicle to be treated more carefully. To be more specific, the reticle-carrying container has an interior with an opening at one end for storing a reticle, and includes a door for covering and blocking the opening and a seal material for sealing the interior hermetically when the door blocks the pod. This reticle-carrying container has a pair of retainers on the insides of the pod and door, and each of the retainers includes an inclined plane for contacting and supporting elastically the upper corner or lower corner of peripheral edge of the reticle.

This structure allows each of the retainers to contact the upper corner or lower corner of peripheral edge of the reticle, thereby supporting the reticle elastically. Moreover, each of the retainers supports the reticle by the inclined plane so that the reticle can be supported without being shifted.

In addition to the inclined plane, each of the retainers may include a concave portion formed on the inside of the inclined plane. The concave portion enables a shock-absorbing function of allowing the deformation of the inclined plane and supporting the reticle elastically, at the time of contact with the upper corner or the lower corner of peripheral edge of the reticle.

With this structure, each of the retainers molded of an elastic member supports the reticle elastically through contact with the upper corner or the lower corner of peripheral edge of the reticle, and the concave portion of the retainer forms a gap that allows the deformation of the inclined plane. This makes it possible to enhance the shock-absorbing function and support the reticle more elastically.

Each of the retainers supports the reticle elastically and also the inclined plane retains the reticle without a shift. This allows the reticle to be held elastically and reliably.

Moreover, the concave portion allows the deformation of the inclined plane and enhances the shock-absorbing function, making it possible to support the reticle in a more elastic and secure manner.

Furthermore, the supporting portions holds the reticle without making contact with the mask pattern formed on the reticle surface, thereby preventing damage and abrasion of the pattern on the reticle.

DESCRIPTION OF THE PREFERRED EMBODIMENTS

Figure 1:
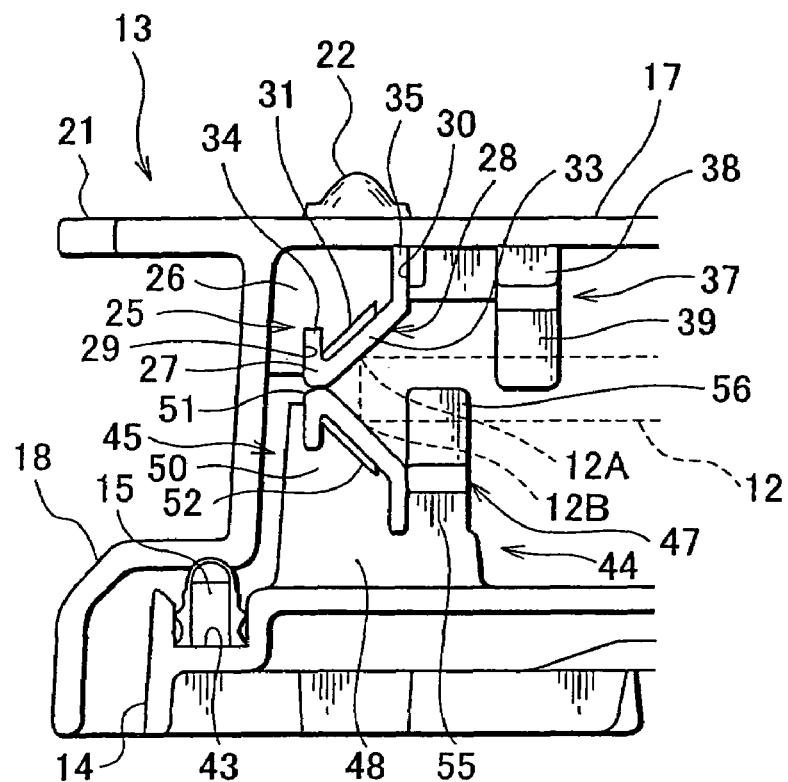
FIG. 1 is a cross sectional view showing major components of a reticle-carrying container according to an embodiment of the present invention.
Figure 2:
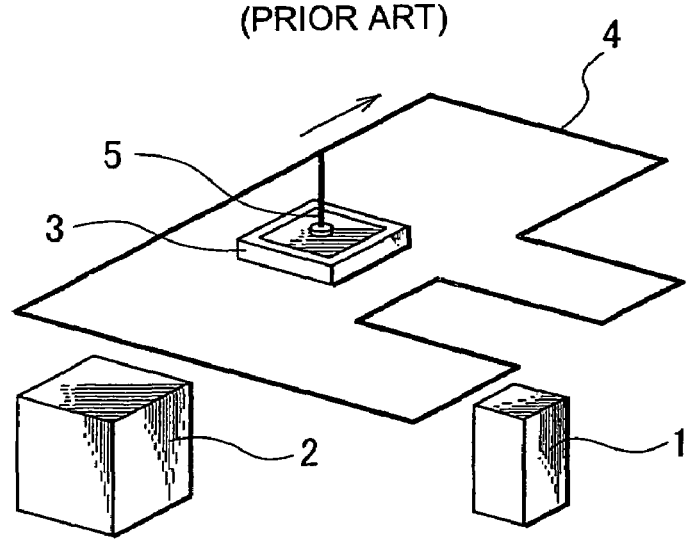
FIG. 2 is an outline structural view showing one example of an apparatus used in the photolithography process.
Figure 5:
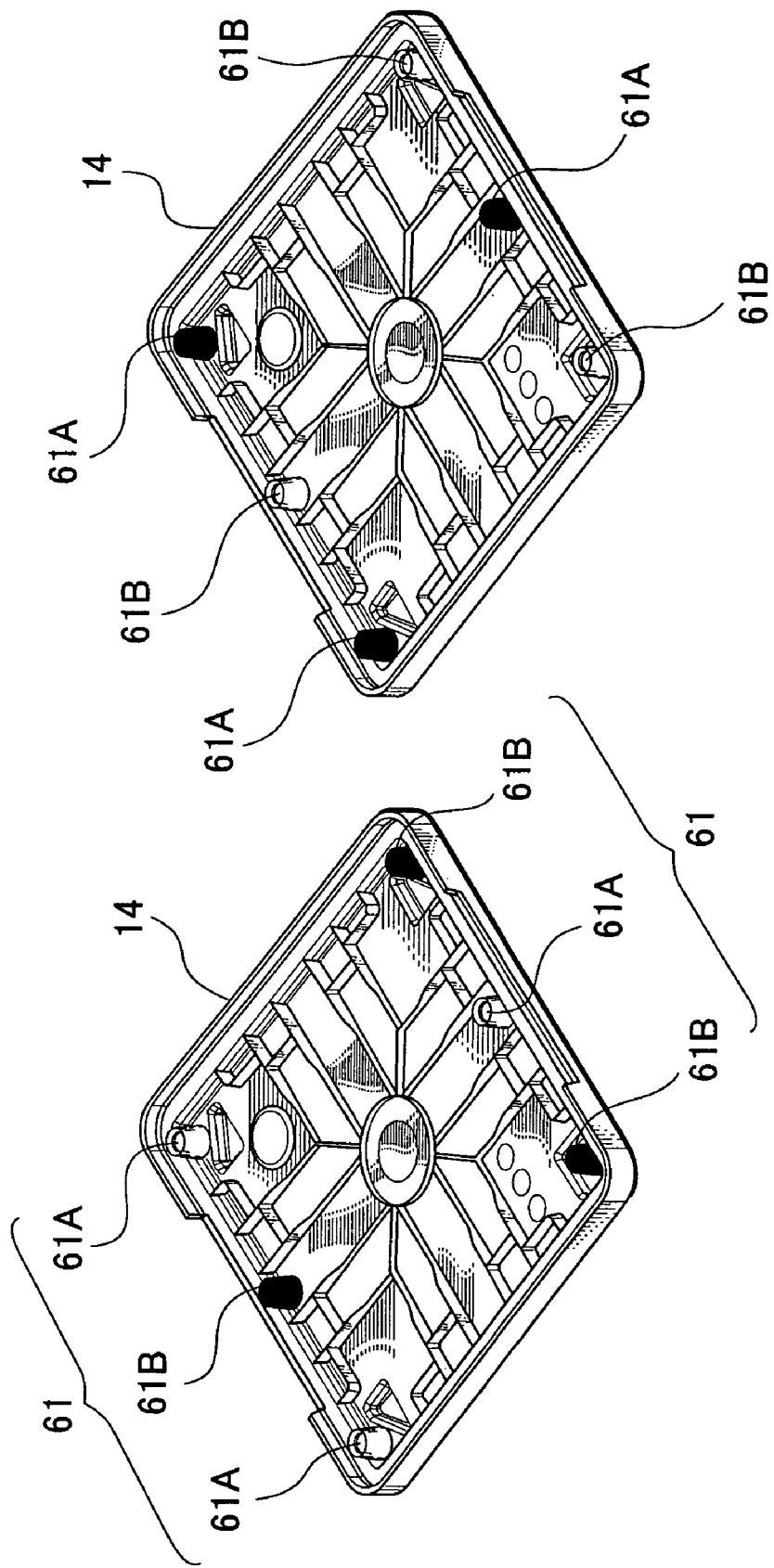
FIG. 5 is a perspective view of the door according to the embodiment of the present invention as seen from its bottom.
Figure 6:
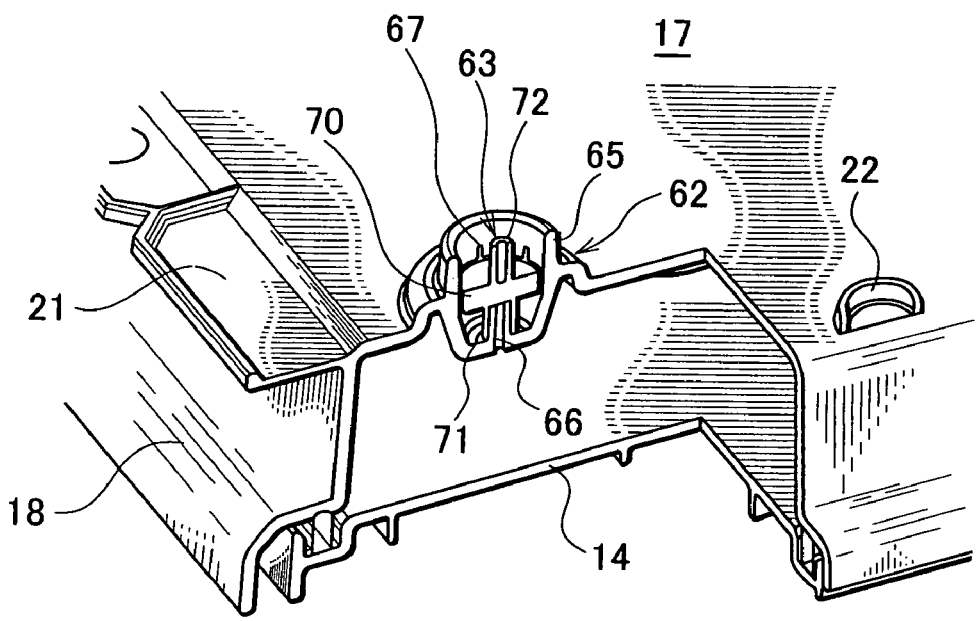
FIG. 6 is a cross sectional view of major components of the membrane filter according to the embodiment of the present invention.
Figure 7:
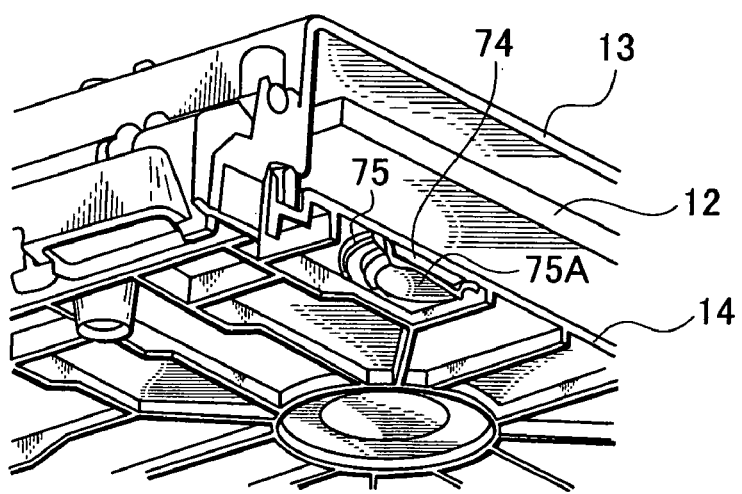
FIG. 7 is a cross sectional view of major components of the wireless tag according to the embodiment of the present invention.

The embodiment of the present invention is described below with reference of the accompanied drawings. The apparatus used in the photolithography process or the like is the same as the conventional one described in relation to the above stated related arts. Thus, a description is here provided only as to the reticle-carrying container. FIG. 1 is a cross sectional view showing the major components of the reticle-carrying container according to this embodiment, FIG. 3 is a perspective view showing the reticle-carrying container according to this embodiment in which the pod and the door are separated from each other, FIG. 4 is a side cross sectional view showing the reticle-carrying container according to this embodiment, FIG. 5 is a perspective view of the door as seen from its bottom, FIG. 6 is a cross sectional view of major components of the membrane filter, and FIG. 7 is a cross sectional view of major components of the wireless tag.

Figure 3:
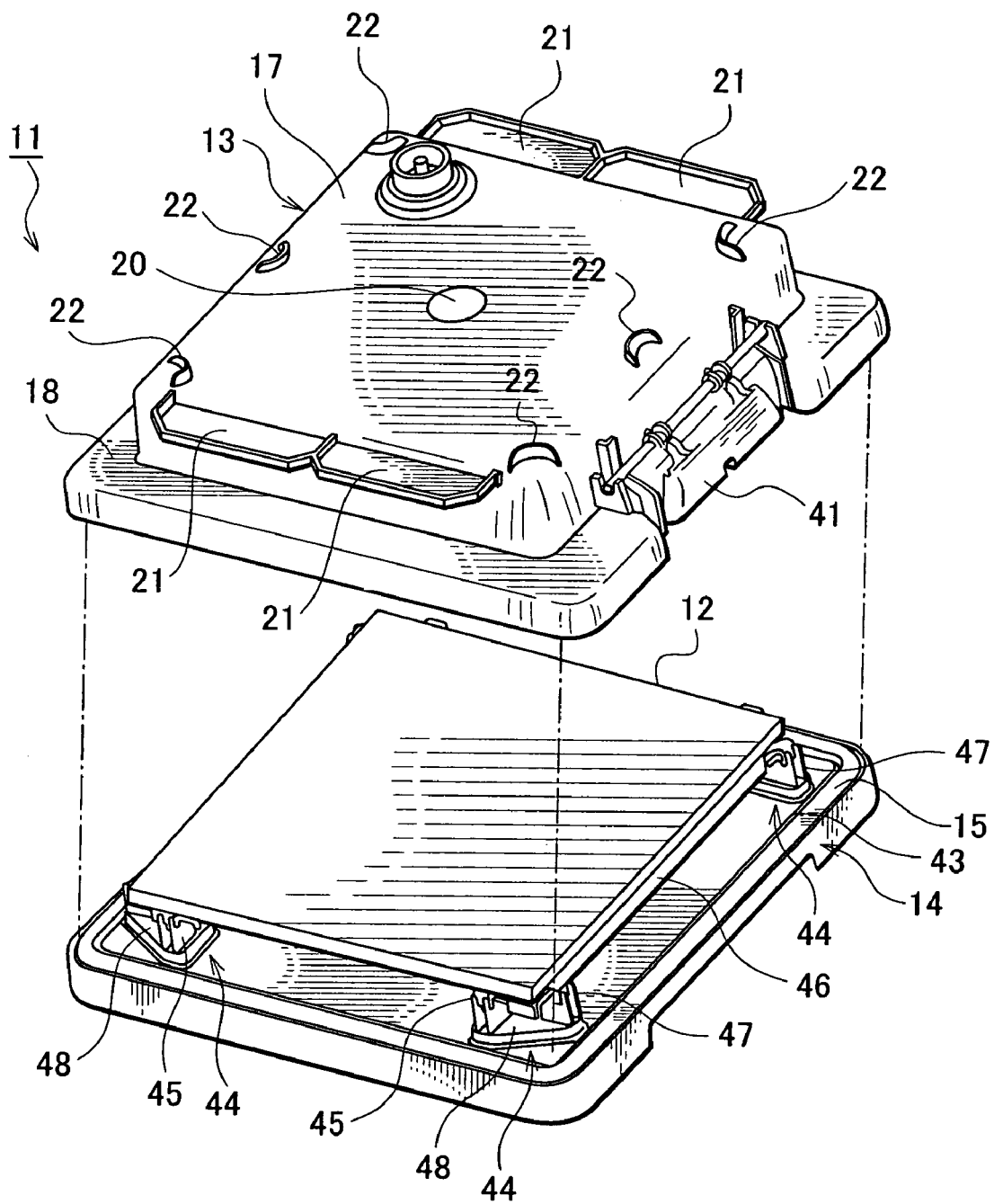
FIG. 3 is a perspective view showing the reticle-carrying container according to the embodiment of the present invention in which the pod and the door are separated from each other.
Figure 4:
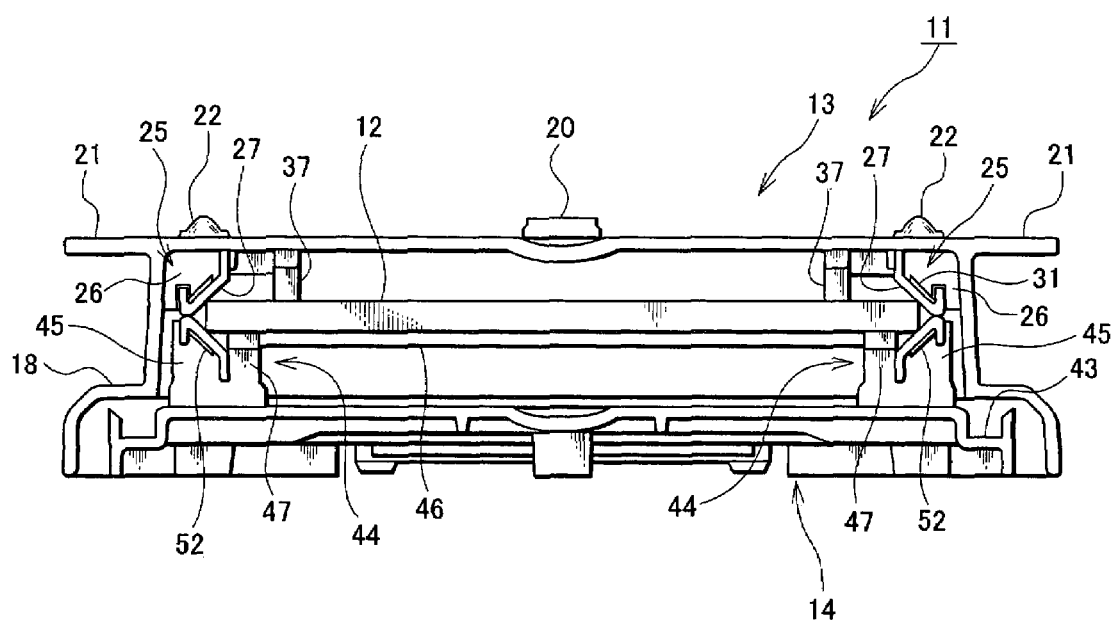
FIG. 4 is a side cross sectional view showing the reticle-carrying container according to the embodiment of the present invention.

As shown in FIG. 3 and FIG. 4, a reticle-carrying container 11 is mainly composed of a pod 13 for storing a reticle 12, a door 14 for blocking the pod 13, and a seal material 15 provided between the pod 13 and the door 14, for sealing the interior hermetically.

The pod 13 is composed of a body portion 17 for storing the reticle 12 in the interior and a peripheral edge engagement portion 18 that is formed integrally with the outer circumference of the body portion 17 and engages with the door 14.

The body portion 17 is formed in the shape of a dish and configured to have a depth at which the reticle 12 is completely stored in the interior. A center handling flange 20 for reticle transfer is provided in the center of the body portion 17. A horizontally extending plate-shaped side handling flange 21 is provided to the peripheral edge of the body portion 17. The center handling flange 20 is coupled with the arm (not shown) of the transfer mechanism to lift the reticle-carrying container 11 and the pod 13. In addition, the side handling flange 21 is used as auxiliary supporting means in separating the door 14 mechanically from the pod 13 within the light exposure apparatus. Moreover, provided on the peripheral edge of the body portion 17 are receiving portions 22 of kinematic pin grooves 61 described later, three each on one side and total six on the two opposed sides. Each of the receiving portions 22 is formed of a plate with a semicircular flat plane. Also, each of the receiving portions 22 with a semicircular flat plane is arranged so as to face its opening outward. In addition, the receiving portions 22 with a semicircular flat plane are formed with a slight inward inclination in such a manner that their front ends become closer to one another than their base ends. This allows the upper kinematic pin grooves 61 of the reticle-carrying container 11 to engage easily with the lower receiving portions 22 of the reticle-carrying container 11, thereby positioning the reticle-carrying container 11 accurately. Therefore, it is possible to stack a plurality of reticle-carrying containers 11 in an easy and stable manner.

Reticle retainers 25 are provided in the vicinities of the four corners inside the body portion 17. The reticle retainer 25 is a member for supporting the reticle 12 in a pair with a reticle retainer 45 described later on the door 14. As shown in FIG. 1 and FIG. 4, the reticle retainer 25 is composed of a retainer receiving portion 26 and a retainer plate 27. The retainer receiving portion 26 is a member for supporting the retainer plate 27. The retainer receiving portions 26 are formed integrally with the body portion 17 in the vicinities of the four corners inside the body portion 17. More specifically, the retainer receiving portion 26 is made of a pentagonal plate material formed on a corner of the body portion 17, and one of the sides of the plate material constitutes an inclined plane 28 that contacts with an upper corner 12A of the reticle 12 and supports the reticle elastically. One end of the side of the retainer receiving portion 26 that forms the inclined plane 28 is provided with a one-end engagement notch 29 that engages with one end of the retainer plane 27. The other end of the side of the retainer receiving portion 26 that forms the inclined plane 28 is provided with an other-end engagement notch 30 that engages with the other end of the retainer plate 27. Besides, a concave portion 31 is provided on the side forming the inclined plane 28. The concave portion 31 is a portion that is provided inside the inclined plane 28 and allows the deformation of the inclined plane 28 at the time of contact with the upper corner 12A of the reticle 12. The concave portion 31 provides a shock-absorbing function for the retainer plate 27. That is, the retainer plate 27 becomes elastically deformed with the elasticity of the retainer plate 27 itself and also by the action of the concave portion 31, absorbs the vibrations, etc. from outside and supports the reticle 12 elastically. A gap of about 1 mm between the concave portion 31 and the retainer plate 27 is acceptable.

The retainer plate 27 is a member that forms the inclined plane 28 for contacting with the upper corner 12A of the reticle 12 and supporting the reticle 12 elastically. The retainer plate 27 is molded of elastic macro molecule materials. To be more specific, the retainer plate 27 is made of elastic materials generating no dust, such as PEE (polyester elastomer), PBT (polybutylene terephthalate) and PP (polyproplylene). The retainer plate 27 is composed of a contact surface plate 33, a one-end engagement portion 34 and an other-end engagement portion 35, and its side is formed in an irregular U shape. The contact surface plate 33 is a member for constituting the inclined plane 28 with the retainer plate 27 engaged with the retainer receiving portion 26. The contact surface plate 33 is molded of elastic synthetic resin, and thus is elastically deformed by its own and also is elastically bent by the action of the above mentioned concave portion 31. This allows the contact surface plate 33 to contact the upper corner 12A of the reticle 12 obliquely and support the reticle 12 elastically.

The one-end engagement portion 34 is a member that engages with the one-end engagement notch 29 of the retainer receiving portion 26 to attach the retainer plate 27 to the retainer receiving portion 26. The other-end engagement portion 35 is a portion that engages with the other-end engagement notch 30 of the retainer receiving portion 26 to attach the retainer plate 27 to the retainer receiving portion 26. Accordingly, the one-end engagement portion 34 and the other-end engagement portion 35 engage with the one-end engagement notch 29 and the other-end engagement notch 30, respectively, which allows the retainer plate 27 to be fixed to the retainer receiving portion 26.

In addition to the reticle retainers 25, pellicle retainers 37 are provided to the vicinities of the four corners inside the body portion 17. The reticle 12 may be not provided with the pellicle, may be provided with the pellicle 46 on its bottom, or may be provided with the pellicle 46 on its both top and bottom. The pellicle retainer 37 is a member that works with the pellicle provided on the top of the reticle 12. The pellicle retainer 37 has the same structure as that of the reticle retainer 25. More specifically, the pellicle retainer 37 is composed of a retainer receiving portion 38 having the same structure as that of the retainer receiving portion 26 of the reticle retainer 25 and a retainer plate 39 having the same structure as that of the retainer plate 27 of the reticle retainer 25. A concave portion (not shown) having the same structure as that of the concave portion 31 of the reticle retainer 25 is provided inside the retainer plate 39.

As shown in FIGS. 3 and 4, the peripheral edge engagement portion 18 of the pod 13 is formed in the shape of a dish in such a manner as to protrude circumferentially from the peripheral edge of the body portion 17. The dish-shaped peripheral edge engagement portion 18 is configured to have a depth at which the door 14 is completely stored in its interior. The opposed sides of the peripheral edge engagement portion 18 are provided with fasteners 41 for holding down the door 14.

The door 14 is a member that engages with the peripheral edge engagement portion 18 of the pod 13 to block the pod 13 and seal the interior hermetically via the seal material 15. As shown in FIGS. 1, 3 and 4, the door 14 is formed in the approximately flat shape and provided with a seal groove 43 on its peripheral edge. The seal material 15 is attached to the seal groove 43 so as to hermetically seal the gap between the pod 13 and the door 14. Door-side support members 44 are provided to the four corners on the top of the door 14. The door-side supporting member 44 is composed of a reticle retainer 45 for supporting the reticle from the both top and bottom in coordination with the reticle retainer 25 on the side of the pod 13, a pellicle retainer 47 for supporting the pellicle 46 attached to the bottom of the reticle 12, and a base plate 48 for supporting the above mentioned components integrally.

The reticle retainer 45 is structured in such a manner that a retainer receiving portion 50 is shifted in a direction perpendicular to the plane of FIG. 1 from the retainer receiving portion 27 of the reticle retainer 25 on the side of the pod 13, thereby displaying mirror symmetry. To be more specific, the reticle retainer 45 is composed of the retainer receiving portion 50 and a retainer plate 51, and these components are configured so as to be mirror symmetrical with respect to the retainer receiving portion 26 and the retainer plate 27 of the reticle retainer 25, respectively. A concave portion 52 inside the retainer plate 51 also has the same functions as those of the concave portion 31 of the reticle retainer 25. More specifically, the retainer plate 51 is elastically bent by the action of the concave portion 52 so as to contact the lower corner 12B of the reticle 12 obliquely and support elastically the reticle 12.

The above mentioned reticle retainer 45 and the reticle retainer 25 are located so as to shift from each other and support the reticle 12 without interference with each other. The reticle 12 is held and supported in a predetermined position between these reticle retainers 25 and 45. Even if the pod 13 is removed, the reticle 12 is continuously supported by the reticle retainer 45 of the door 14, at a predetermined distance from the door 14.

A pellicle receiving portion 56 of the pellicle retainer 47 is also shifted in a direction transverse with respect to the plane of FIG. 1 from the retainer receiving portion 39 of the pellicle retainer 37 on the side of the pod 13, thereby displaying mirror symmetry. More specifically, the pellicle retainer 47 is composed of a retainer receiving portion 55 that is mirror symmetrical with the retainer receiving portion 38 of the pellicle retainer 37 on the side of the pod 13 and a retainer plate 56 that is mirror symmetrical with the retainer plate 39. A concave portion (not shown) having the same structure as that of the concave portion of the pellicle retainer 37 is provided inside the retainer plate 56.

As shown in FIG. 5, two pairs of kinematic pin grooves 61 are arranged on the back of the door 14. The kinematic pin groove 61 is a member for positioning and attaching the door 14 to the light exposure apparatus. The total six kinematic pin grooves 61, three each at the apexes of an approximately isosceles triangle, are provided in two pairs (61A and 61B) with a 180-degree turn from each other. This is because, even if the operator has attached the reticle-carrying container 11 to the light exposure apparatus in a 180-degree-turned orientation by mistake, these pin grooves allow the reticle-carrying container 11 to be fit into the apparatus.

As shown in FIG. 6, a membrane filter attachment portion 62 is formed in the pod 13. The membrane filter attachment portion 62 is a portion for allowing the membrane filter 63 to be securely attached and easily removed. The membrane filter attachment portion 62 is composed of a tube guide 65, a filter engagement pipe 66 and a stopper 67.

The tube guide 65 is a portion for storing and fixing the membrane filter 63 in the interior. The tube guide 65 is arranged integrally with the body portion 17 of the pod 13. The outside of the tube guide 65 has an opening through which the membrane filter 63 is attached or removed. Moreover, the tube guide 65 also works as a tube for connection with a gas supply tube (not shown) for exchanging gases in the reticle-carrying container 11. The inside of the tube guide 65 is covered and provided with the filter engagement pipe 66. The filter engagement pipe 66 is a portion for engagement with an engagement pipe 71 of the membrane filter 63. The filter engagement pipe 66 is structured in the tube guide 65, as a small-diameter pipe extruding outward from the inside bottom of the tube guide 65. The stopper 67 is provided in the center of the inside surface of the tube guide 65. The stopper 67 is a member for fixing the membrane filter 63 so as not to fall off the tube guide 65.

The membrane filter 63 is a filter that allows the passage of a gas between the inside and outside of the reticle-carrying container 11. The membrane filter 63 prevents the entry of dust, etc. and allows only a gas to pass between the inside and outside of the reticle-carrying container 11. The membrane filter 63 is composed of a filter body portion 70, an engagement pipe 71 and an opening pipe 72.

The filter body portion 70 is formed in the shape of a thick-walled disc and stores a filter in its interior. The filter body portion 70 has a diameter so as to be locked on the stopper 67. The engagement pipe 71 is a member for making inside of the filter body portion 70 communicates with inside of the reticle-carrying container 11. When the membrane filter 63 is attached to the tube guide 65, the engagement pipe 71 engages with the filter engagement pipe 66, thereby making the inside of the filter body portion 70 communicates with the inside of the reticle-carrying container 11. The opening pipe 72 is a portion for making the inside of reticle-carrying container 11 communicate with outside via a filter. As such a filter, a 0.1- to 0.5-μm mesh is fitted so as to eliminate inert gases and dust elements in dry air.

As illustrated in FIG. 7, a wireless tag 74 is provided to the outer surface of the door 14. The wireless tag 74 is covered with a covering plate 75 and attached to the outer surface of the door 14. When covering the wireless tag 74 completely, the covering plate 75 is welded at its circumference and thus the interior is sealed. A concave portion 75A for storing the wireless tag 74 is formed in the covering plate 75. When the wireless tag 74 is stored in the concave portion 75A of the covering plate 75, the covering plate 75 is welded at its circumference to the outer surface of the door 14. This allows the wireless tag 74 to be hermetically stored in the covering plate 75. This structure is to prevent the wireless tag 74 from falling off or suffering mechanical damage during transport of the reticle-carrying container 11. In addition, there is also the purpose of avoiding contamination of the light exposure apparatus with the wireless tag itself. The wireless tag 74 is a device that allows the writing and reading of information in a non-contact manner according to changes in electromagnetic waves from outside. The wireless tag 74 holds various types of management information required for operations and storage.

The reticle-carrying container 11 configured in this manner is used as described below. Here, the description is given taking as an example a case where the reticle-carrying container 11 is used for printing a circuit pattern on a semiconductor wafer.

Firstly, the reticle 12 is stored in the reticle-carrying container 11. At that time, the reticle 12 is placed on the reticle retainer 45 of the door 14, and then the pod 13 is mounted and fixed with the fasteners 41. This allows the reticle 12 to be supported between the reticle retainer 45 on the side of the door 14 and the reticle retainer 25 on the side of the pod 13. More specifically, the retainer plate 51 of the reticle retainer 45 and the retainer plate 27 of the reticle retainer 25 contact obliquely and support the lower corner 12B of the reticle 12 and the upper corner 12A of the reticle 12, respectively. At that time, concave portions 52 and 31 inside the retainer plates 51 and 27 allow the deformation of the retainer plates 51 and 27, thereby supporting the reticle 12 elastically. This allows the reticle 12 to be restrained in all the degrees of freedom and fixed within the reticle-carrying container 11, without suffering any damage on its surface.

If the reticle 12 is provided with the pellicle 46, the pellicle 46 is fixed with the pellicle retainer 47 in the same way as the case of the reticle 12.

In this manner, the reticles 12 are stored one by one in the reticle-carrying containers 11. The operator stacks a required number of reticle-carrying containers in the reticle stocker 2 for attachment. All the subsequent operations in relation to the reticle-carrying container 11, such as transportation, are performed in a mechanical fashion. More specifically, all the operations including taking the reticle-carrying container 11 out of the reticle stocker 2, putting it into storage, moving it on the transfer rail by means of the transfer crane, and setting the reticle 12 of the reticle-carrying container 11 to the light exposure apparatus 1, are mechanically carried out (SMIF: Standard Mechanical Interface).

The transfer mechanism 5 of the transfer rail 4 is connected to the reticle-carrying container 11 in the reticle stocker 2 by the center handling flange 20 to lift the reticle-carrying container 11. Then, reticle-carrying container 11 is moved toward the light exposure apparatus 1 by the transfer rail 4 and rotated as required.

When transferred to the light exposure apparatus 1, the reticle-carrying container 11 is positioned in a predetermined position within the light exposure apparatus 1, and then the kinematic pins (not shown) of the light exposure apparatus 1 are engaged in the kinematic pin grooves 61. Then, the fasteners 41 of the reticle-carrying container 11 are mechanically released, the side handling flange 21 is caught by the arm (not shown) of the opening/closing mechanism, and the pod 13 is separated from the door 14. Next, the door 14 is moved down and the reticle 12 is introduced into the light exposure apparatus 1. After that, the reticle 12 is moved toward the automatic exposure stage (not shown) of the light exposure apparatus 1, positioned accurately in a predetermined position on the already attached semiconductor wafer, and light-exposed in an automatic manner.

Upon completion of the light exposure, the reticle 12 is returned to the door 14 of the reticle-carrying container 11, and aligned with the pod 13 by elevating the door 14, and fixed with the fasteners 41. At that time, the upper corner 12A and lower corner 12B of the reticle 12 are supported between the reticle retainers 24 and 45, and the reticle 12 is restrained in all the degrees of freedom and fixed within the reticle-carrying container 11 without suffering any damage on its surface, as described above. Then, the kinematic pins are separated from the kinematic pin grooves 61, the reticle 12 is moved on the transfer rail 4 and returned to the reticle stocker 2 by the transfer mechanism 5.

These operation processes are controlled on the basis of the information recorded in the wireless tag 74. The wireless tag 74 on the door 14 of the reticle-carrying container 11 stores various types of information including the kind of the reticle 12 and the operation histories. The reader (not shown) of the light exposure apparatus 1 reads the information from the wireless tag 74 in a non-contact manner and the light exposure apparatus 1 exercises control according to the information. After completion of the light exposure, if required, the light exposure apparatus 1 uses the writer (not shown) to write the history records and operation records of the reticle 12 and the reticle-carrying container 11 into the wireless tag 74. This allows exposure and management operations to be smoothly carried out.

Since the wireless tag 74 is hermetically sealed by the covering plate 75, it is possible to prevent the wireless tag 74 from falling off and suffering mechanical damage and to avoid the contamination of the light exposure apparatus with the wireless tag 74 itself.

Suppose that the reticle-carrying container 11 is located in an environment with changes in atmospheric pressure. For example, if the reticle-carrying container 11 is placed under a relatively low atmospheric pressure in the sky, as in the case of air transport, or placed under a relatively high atmospheric pressure on the ground, a pressure in the reticle-carrying container 11 may be lower than the outside pressure. In this case, it is difficult to separate the pod 13 from the door 14. On this account, the membrane filter 63 allows the passage of a gas between the inside and outside of the reticle-carrying container 11, which prevents a pressure in the reticle-carrying container 11 from being higher than an external pressure. This makes it easy to separate the pod 13 from the door 14.

In addition, in changing the gases in the reticle-carrying container 11, a gas supply tube is inserted into and connected with the tube guide 65 of the membrane attachment portion 62 to send an inert gas or dry air to the tube guide 65.

As described above, the upper and the lower corners of the reticle 12 contact the inclined plane 28 of the reticle retainer 25 and support the reticle 12 without making contact with the mask pattern or the like formed on the surface of the reticle 12. This avoids damage and abrasion of the pattern on the reticle surface. As the result, it is possible to support the reticle 12 in a safe and secure manner and treat it more carefully.

Additionally, varied types of information are recorded and managed in the wireless tag 74, which makes it possible to increase operating efficiency based on the information. The wireless tag 74 is hermetically sealed by the covering plate 75, and thus it is possible to prevent the wireless tag 74 from falling off and suffering mechanical damage and to avoid the light exposure apparatus from contaminated with the wireless tag 74 itself.

Moreover, the membrane filter 63 allows the passage of a gas between the inside and outside of the reticle-carrying container 11, which prevents a pressure in the reticle-carrying container 11 from becoming higher than an external pressure. This makes it easy to separate the pod 13 from the door 14. In addition, this also makes it easy to change the gases in the reticle-carrying container 11.

In the above mentioned embodiment, the membrane filter 63 is provided on the side of the pod 13. Alternatively, this may be provided on the side of the door 14. In addition, the number of the membrane filter 63 is not limited to one and may be two. One or a plurality of the membrane filters 63 may be provided to either the pod 13 or the door 14 or both. In this case, the membrane filters 63 must be installed in positions that do not interfere with the other components.

Furthermore, in the above stated embodiment, one wireless tag 74 is attached to the outer surface of the door 14. Alternatively, as required, two or more wireless tags may be provided. Also, the position of the attachment is not limited to the door 14 and may be the pod 13 or both. Depending on the required function or the relationship between the reader and the writer, the wireless tag 74 may be attached to the pod 13. In addition, the information to be recorded in the wireless tag 74 is not limited to operation histories and may be other various kinds of information.

What is claimed is:

1. A reticle-carrying container, comprising:
   a pod for storing a reticle, the pod having a body portion with walls defining an interior with corners and extending to an opening;
   a door for closing the opening;
   a seal for hermetically sealing the interior with the opening closed by the door;
   a pair of retainers which cooperate to hold a corner of the stored reticle therebetween, each of the retainers being molded of an elastic material and presenting an inclined surface, oblique to the walls, for contact with one edge of the corner of the stored reticle and each of the retainers having a gap located internally within the retainer, adjacent to and spaced from the inclined surface, the gap providing a shock-absorbing function by allowing elastic deformation of the inclined surface, wherein each of the retainers includes a retainer receiving portion formed integrally with the pod or door and having a cut-out at one surface, and a retainer plate providing the inclined surface, supported on the retainer receiving portion and covering the cut-out to define the gap between the retainer receiving portion and the retainer plate.

2. The reticle-carrying container according to claim 1 further comprising a membrane filter attachment portion is formed on at least one of the pod and the door, and a membrane filter attached to the membrane filter attachment portion.

3. The reticle-carrying container according to claim 1 further comprising a wireless tag hermetically sealed in one of the door and an outer surface of the pod.

4. The reticle-carrying container according to claim 1 comprising said pair of retainers positioned at each of the four corners of the pod.

5. The reticle-carrying container according to claim 4 further comprising a wireless tag hermetically sealed in one of the door and an outer surface of the pod.

6. The reticle-carrying container according to claim 1 wherein the gap has a width of approximately 1 mm.

7. The reticle-carrying container according to claim 1 wherein the retainers are integrally formed with the pod walls and the door, respectively.

8. The reticle-carrying container according to claim 1 wherein each gap is located opposite a point of contact with the reticle on an inclined plane.

9. A reticle-carrying container, comprising:
   a pod for storing a reticle, the pod having a body portion with walls defining an interior with corners and extending to an opening;
   a door for closing the opening;
   a seal for hermetically sealing the interior with the opening closed by the door;
   a pair of retainers which cooperate to hold a corner of the stored reticle therebetween, the retainers being molded of an elastic material and including:
      a first retainer mounted at one corner on the interior of the pod, the first retainer including a first retainer receiving plate portion extending from the one corner and terminating at an edge oblique to the walls and a first retainer plate supported on the edge of the first retainer receiving plate and presenting a first inclined plane, oblique to the walls for contact with one edge of the corner of the stored reticle; and
      a second retainer extending from an interior surface of the door in opposition to the first retainer, the second retainer including a second retainer receiving plate portion extending from the interior surface of the door and terminating at an edge and a second retainer plate supported on the edge of the second retainer receiving plate and presenting a second inclined plane, oblique to the interior surface of the door for contact with a second edge of the corner of the stored reticle, opposite the first edge of the corner of the stored reticle; and wherein the edges of the first and second retainer receiving plate portions each have a concave cut-out defining a gap between each of the edges and the first and second retainer plates respectively supported thereon, the gaps providing a shock-absorbing function by allowing elastic deformation of the first and second retainer plates.

10. The reticle-carrying container according to claim 9 comprising said pair of retainers positioned at each of the four corners of the pod.

11. The reticle-carrying container according to claim 9 wherein the gaps have a width of approximately 1 mm.

12. The reticle-carrying container according to claim 9 wherein the first and second retainer receiving plates are integrally formed with the pod walls and the door, respectively.

13. The reticle-carrying container according to claim 9 wherein each gap is located opposite a point of contact with the reticle on an inclined plane.

* * * * *